United States Patent
Sun

(10) Patent No.: US 8,384,216 B2
(45) Date of Patent: Feb. 26, 2013

(54) PACKAGE STRUCTURE AND MANUFACTURING METHOD THEREOF

(75) Inventor: Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 13/184,578

(22) Filed: Jul. 18, 2011

(65) Prior Publication Data

US 2012/0292762 A1   Nov. 22, 2012

(30) Foreign Application Priority Data

May 20, 2011   (TW) .................................. 100117796

(51) Int. Cl.
*H01L 21/00*   (2006.01)

(52) U.S. Cl. ........ 257/738; 257/690; 257/701; 257/779; 257/E21.511; 361/749; 174/250; 174/260; 174/268; 29/825; 29/829; 29/874

(58) Field of Classification Search .................. 257/690, 257/701, 738, 779, E21.511; 361/749; 174/250, 174/260, 268; 29/825, 829, 847
See application file for complete search history.

(56) References Cited

U.S. PATENT DOCUMENTS

| 2007/0020804 A1* | 1/2007 | Kurita et al. .................. 438/106 |
| 2009/0211796 A1* | 8/2009 | Chinda et al. ................. 174/260 |

* cited by examiner

*Primary Examiner* — Peniel M Gumedzoe
(74) *Attorney, Agent, or Firm* — Jianq Chyun IP Office

(57) ABSTRACT

A manufacturing method of a package structure is provided. A metal substrate is provided. The metal substrate has a first surface where a first seed layer is formed. A patterned insulating layer is formed on the first seed layer and exposes a portion of the first seed layer. A patterned circuit layer is formed on the exposed portion of the first seed layer and covers a portion of the patterned insulating layer. A chip-bonding process is performed to electrically connect a chip to the patterned circuit layer. An encapsulant encapsulating the chip and the patterned circuit layer and covering a portion of the pattered insulating layer is formed. The metal substrate and the first seed layer are removed to expose a bottom surface of the patterned insulating layer and a lower surface of the patterned circuit layer. Solder balls are formed on the lower surface of the patterned circuit layer.

9 Claims, 3 Drawing Sheets

PACKAGE STRUCTURE AND MANUFACTURING METHOD THEREOF

CROSS-REFERENCE TO RELATED APPLICATION

This application claims the priority benefit of Taiwan application serial no. 100117796, filed May 20, 2011. The entirety of the above-mentioned patent application is hereby incorporated by reference herein and made a part of this specification.

BACKGROUND OF THE INVENTION

Field of the Invention

The invention relates to a package structure and a manufacturing method thereof. More particularly, the invention relates to a package structure with a relatively small thickness and a manufacturing method of the package structure.

BACKGROUND OF THE INVENTION

A chip package aims at protecting an exposed chip, lowering the density of chip contacts, and effectively dissipating heat generated by the chip. A common way to package the chip is to configure the chip to a package carrier by performing a wire-bonding process or a flip-chip bonding process, such that contacts on the chip can be electrically connected to the package carrier. Therefore, the contacts on the chip can be re-distributed through the package carrier, so as to comply with contact distribution of external devices of next hierarchy.

Generally, in order to form the package carrier, a core dielectric layer often serves as a core material, and patterned circuit layers and patterned dielectric layers are alternately stacked on the core dielectric layer by performing a fully additive process, a semi-additive process, a subtractive process, or any other process. Consequently, the core dielectric layer accounts for a great proportion of the whole thickness of the package carrier. If the thickness of the core dielectric layer cannot be effectively reduced, it will be very difficult to reduce the thickness of the chip package.

SUMMARY OF THE INVENTION

The invention is directed to a package structure with a relatively small thickness.

The invention is further directed to a manufacturing method of a package structure. By applying the manufacturing method, the aforesaid package structure can be formed.

In an embodiment of the invention, a manufacturing method of a package structure is provided. According to the manufacturing method, a metal substrate is provided. The metal substrate has a first surface on which a first seed layer is formed. A patterned insulating layer is formed on the first seed layer, and the patterned insulating layer exposes a portion of the first seed layer. A patterned circuit layer is formed on the portion of the first seed layer exposed by the patterned insulating layer. The patterned circuit layer covers a portion of the patterned insulating layer. A chip-bonding process is performed to electrically connect a chip to the patterned circuit layer. An encapsulant is formed. The encapsulant encapsulates the chip and the patterned circuit layer and covers a portion of the pattered insulating layer. The metal substrate and the first seed layer are removed to expose a bottom surface of the patterned insulating layer and a lower surface of the patterned circuit layer. A plurality of solder balls are formed on the lower surface of the patterned circuit layer.

According to an embodiment of the invention, the steps of forming the patterned circuit layer includes: forming a second seed layer on the patterned insulating layer, wherein the second seed layer encapsulates the patterned insulating layer; forming a patterned photoresist layer on a portion of the first seed layer, a portion of the second seed layer, and a second surface of the metal substrate opposite to the first surface, wherein the patterned photoresist layer exposes a portion of the first seed layer and a portion of the second seed layer; plating the patterned circuit layer onto the portion of the first seed layer and the portion of the second seed layer exposed by the patterned photoresist layer, wherein the patterned circuit layer is plated with use of the patterned photoresist layer as a plating mask; removing the patterned photoresist layer and the portion of the second seed layer underlying the patterned photoresist layer to expose a portion of the patterned insulating layer and the second surface of the metal substrate.

According to an embodiment of the invention, the manufacturing method of the package structure further includes forming a surface treatment layer on the patterned circuit layer before removing the patterned photoresist layer and the portion of the second seed layer underlying the patterned photoresist layer.

According to an embodiment of the invention, the step of forming the patterned circuit layer includes: forming a metal layer on the first seed layer, wherein the metal layer covers the patterned insulating layer and a portion of the first seed layer; forming a patterned photoresist layer on the metal layer, wherein the patterned photoresist layer exposes a portion of the metal layer; removing the portion of the metal layer with use of the patterned photoresist layer as an etching mask, so as to expose a portion of the patterned insulating layer and form the patterned circuit layer; removing the patterned photoresist layer.

According to an embodiment of the invention, the manufacturing method of the package structure further includes forming a surface treatment layer on the patterned circuit layer after removing the patterned photoresist layer.

According to an embodiment of the invention, the chip-bonding process includes a wire-bonding process or a flip-chip bonding process.

In an embodiment of the invention, a package structure that includes a patterned insulating layer, a patterned circuit layer, a plurality of solder balls, a chip, and an encapsulant is provided. The patterned insulating layer has a bottom surface. The patterned circuit layer is configured on the patterned insulating layer and covers a portion of the patterned insulating layer. A lower surface of the patterned circuit layer is substantially aligned to a bottom surface of the patterned insulating layer. The solder balls are configured on the lower surface of the patterned circuit layer. The chip is electrically connected to the patterned circuit layer. The encapsulant encapsulates the chip and the patterned circuit layer and covers a portion of the pattered insulating layer.

According to an embodiment of the invention, the package structure further includes a surface treatment layer that is configured on the patterned circuit layer.

According to an embodiment of the invention, the surface treatment layer includes a nickel layer, a gold layer, a silver layer, or a nickel palladium gold layer.

According to an embodiment of the invention, the chip is electrically connected to the patterned circuit layer by performing a wire-bonding process or a flip-chip bonding process.

Based on the above, the package structure described in the embodiments of the invention has the patterned insulating layer. Hence, when the solder balls are formed on the lower surface of the patterned circuit layer, the patterned insulating layer can protect the adjacent solder balls from short circuits. Accordingly, the package structure described in the embodiments of the invention can have favorable electrical performance. Moreover, the metal substrate serves as the carrier according to the embodiments of the invention, and the patterned circuit layer is formed by performing a plating process or a subtractive process. After the chip is completely packaged, the metal substrate and the seed layer are removed. Thereby, in comparison with the conventional package structure that has the core dielectric layer, the package structure described in the embodiments of the invention can have a relatively small thickness.

Several exemplary embodiments accompanied with figures are described in detail below to further describe in the invention in details.

BRIEF DESCRIPTION OF THE DRAWINGS

The accompanying drawings are included to provide a further understanding of the invention, and are incorporated in and constitute a part of this specification. The drawings illustrate embodiments of the disclosure and, together with the description, serve to explain the principles of the invention.

DESCRIPTION OF EMBODIMENTS

Figure 1A:
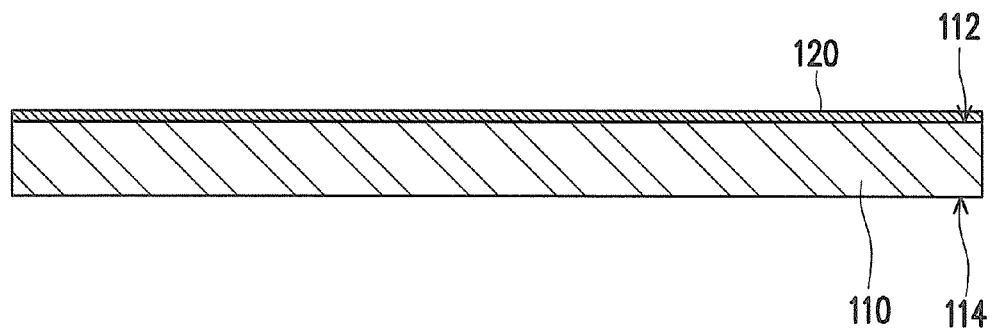
FIG. 1A to FIG. 1E are schematic cross-sectional views illustrating a manufacturing method of a package carrier according to an embodiment of the invention.

FIG. 1A to FIG. 1E are schematic cross-sectional views illustrating a manufacturing method of a package carrier according to an embodiment of the invention. With reference to FIG. 1A, according to the manufacturing method of the package structure in this embodiment, a metal substrate 110 is provided. Specifically, the metal substrate 110 has a first surface 112 and a second surface 114 opposite to the first surface 112, and a first seed layer 120 is already formed on the first surface 112. In this embodiment, a material of the first seed layer 120 is copper, for instance, and the first seed layer 120 is formed by plating, for instance.

Figure 1B:
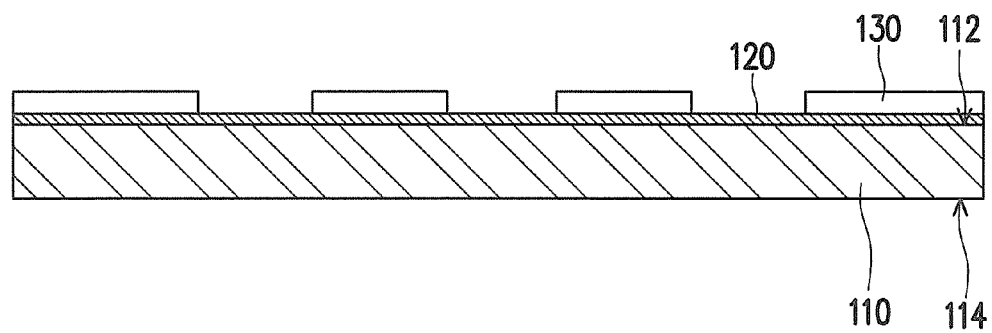

With reference to FIG. 1B, a patterned insulating layer 130 is formed on the first seed layer 120. Here, the patterned insulating layer 130 exposes a portion of the first seed layer 120. In this embodiment, the patterned insulating layer 130 is formed by performing a screen printing process or an exposure and development process, for instance.

Figure 1C:
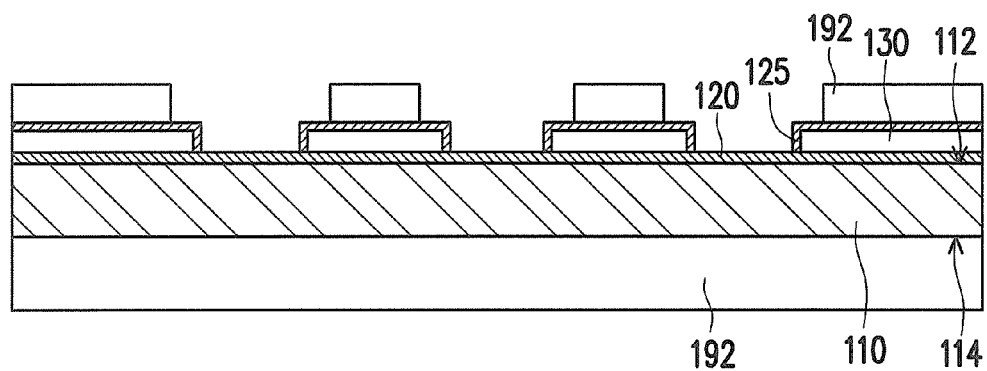

With reference to FIG. 1C, a second seed layer 125 is formed on the patterned insulating layer 130. The second seed layer 125 encapsulates the patterned insulating layer 130, and the second seed layer 125 is made of copper, for instance. A patterned photoresist layer 192 is formed on a portion of the first seed layer 120, a portion of the second seed layer 125, and the second surface 114 of the metal substrate 110. The patterned photoresist layer 192 exposes a portion of the first seed layer 120 and a portion of the second seed layer 125.

Figure 1D:
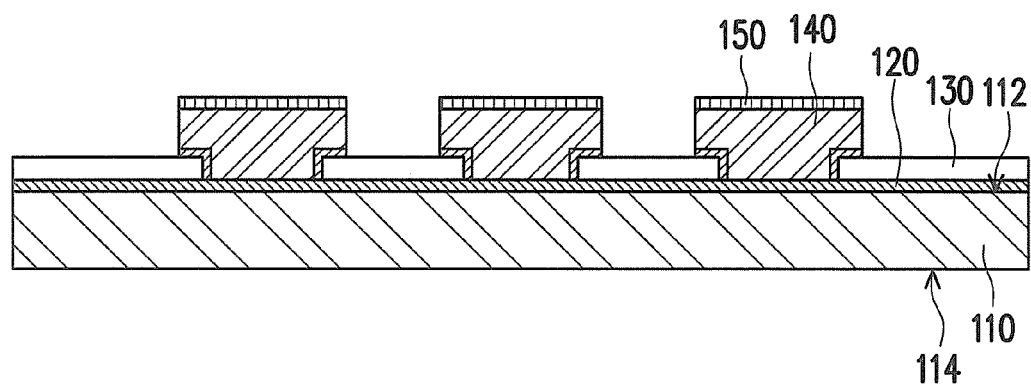

With reference to FIG. 1C and FIG. 1D, a patterned circuit layer 140 is plated onto the portion of the first seed layer 120 and the portion of the second seed layer 125 which are exposed by the patterned photoresist layer 192. Here, the patterned circuit layer 140 is plated with use of the patterned photoresist layer 192 as a plating mask. Namely, the patterned circuit layer 140 is formed by performing a plating process according to this embodiment. Specifically, the line width and the thickness of the patterned circuit layer 140 can be adjusted by controlling the patterned photoresist layer 192 in this embodiment. Here, the line width of the patterned circuit layer 140 is less than 30 µm, for instance, and therefore the patterned circuit layer 140 of this embodiment can be considered as a fine circuit layer in comparison with the normal circuit layer.

With reference to FIG. 1D, a surface treatment layer 150 is formed on the patterned circuit layer 140. The surface treatment layer 150 is plated onto the patterned circuit layer 140 with use of the patterned photoresist layer 192 (shown in FIG. 1C) as a plating mask, for instance. The surface treatment layer 150 is, for instance, a nickel layer, a gold layer, a silver layer, a nickel palladium gold layer, or any other appropriate material layer, which should not be construed as a limitation to the invention. The patterned photoresist layer 192 and the portion of the second seed layer 125 underlying the patterned photoresist layer 192 are removed, so as to expose a portion of the patterned insulating layer 130 and the second surface 114 of the metal substrate 110. The patterned circuit layer 140 is configured on the portion of the first seed layer 120 exposed by the patterned insulating layer 130 and covers a portion of the patterned insulating layer 130.

Figure 1E:
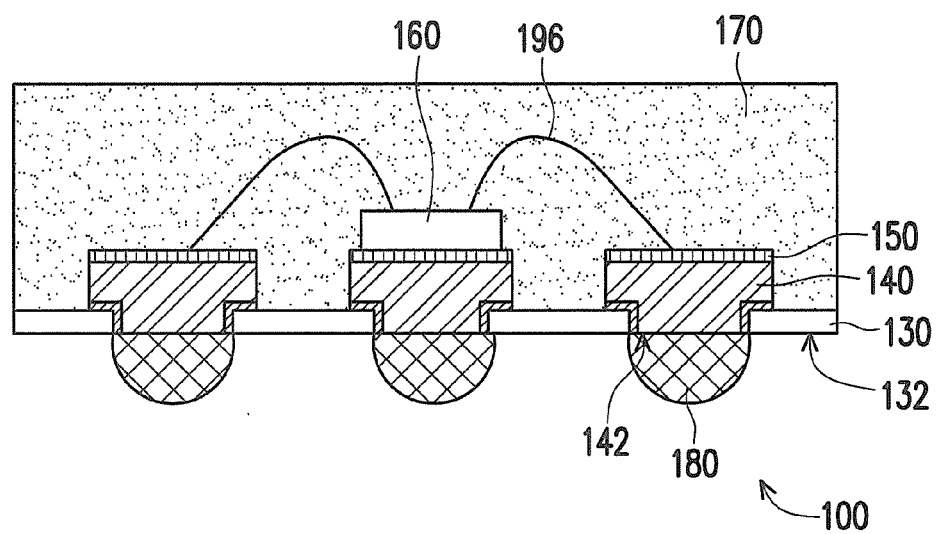

With reference to FIG. 1E, a chip-bonding process is performed to electrically connect a chip 160 to the surface treatment layer 150 located above the patterned circuit layer 140. The chip-bonding process in this embodiment is a wire-bonding process, for instance. According to this embodiment, the chip 160 can be electrically connected to the patterned circuit layer 140 through a plurality of bonding wires 196. Here, the chip 160, for instance, a chip module or an individual chip that includes a light emitting diode (LED) chip, a laser diode chip, a graphic chip, a memory chip, a semiconductor chip, and so on.

Although the chip 160 is electrically connected to the surface treatment layer 150 located above the patterned circuit layer 140 by performing the wire-bonding process, the way to bond the chip 160 and the patterned circuit layer 140 is not limited in the invention. In other embodiments of the invention, the chip 160 can also be electrically connected to the surface treatment layer 150 above the patterned circuit layer 140 by performing a flip-chip bonding process. Namely, the way to bond the chip 160 and the patterned circuit layer 140 is exemplary and should not be construed as a limitation to the invention.

With reference to FIG. 1E, an encapsulant 170 is formed. The encapsulant 170 encapsulates the chip 160, the surface treatment layer 150, and the patterned circuit layer 140 and covers the exposed portion of the patterned insulating layer 130. The metal substrate 110 and the first seed layer 120 are removed to expose a bottom surface 132 of the patterned insulating layer 130 and a lower surface 142 of the patterned circuit layer 140. The lower surface 142 of the patterned circuit layer 140 is substantially aligned to the bottom surface 132 of the patterned insulating layer 130. A plurality of solder balls 180 are then formed on the lower surface 142 of the patterned circuit layer 140. So far, the fabrication of the package structure 100 is substantially completed.

As indicated in FIG. 1E, the package structure 100 includes the patterned insulating layer 130, the patterned circuit layer 140, the surface treatment layer 150, the chip 160, the encapsulant 170, the solder balls 180, and the bonding wires 196.

The patterned insulating layer 130 has the bottom surface 132. The patterned circuit layer 140 is configured on the patterned insulating layer 130 and covers a portion of the patterned insulating layer 130. The lower surface 142 of the patterned circuit layer 140 is substantially aligned to the bottom surface 132 of the patterned insulating layer 130. The surface treatment layer 150 is configured on the patterned circuit layer 140. Here, the surface treatment layer 150 is a nickel layer, a gold layer, a silver layer, or a nickel palladium gold layer, for instance. The chip 160 is electrically connected to the patterned circuit layer 140 through the bonding wires 196. The encapsulant 170 encapsulates the chip 160, the surface treatment layer 150, and the patterned circuit layer 140 and covers a portion of the pattered insulating layer 130. The solder balls 180 are configured on the lower surface 142 of the patterned circuit layer 140.

The package structure 100 of this embodiment has the patterned insulating layer 130. Therefore, when the solder balls 180 are formed on the lower surface 142 of the patterned circuit layer 140, the patterned insulating layer 130 can protect the adjacent solder balls 180 from short circuits caused by a reflow process. As such, the package structure 100 of this embodiment can have favorable electrical performance and structural reliability. In the manufacturing method of the package structure 100 of this embodiment, the chip 160 is completely packaged (i.e., the encapsulant 170 is formed), and the metal substrate 110 and the first seed layer 120 covering the metal substrate 110 are removed. Thereby, in comparison with the conventional package structure that has the core dielectric layer, the package structure 100 described in this embodiment of the invention does not have the metal substrate 110 and thus can have a relatively small thickness. In addition, the line width and the thickness of the patterned circuit layer 140 can be adjusted by controlling the patterned photoresist layer 192 according to this embodiment, and therefore the required fine circuit layer can be formed.

Figure 2A:
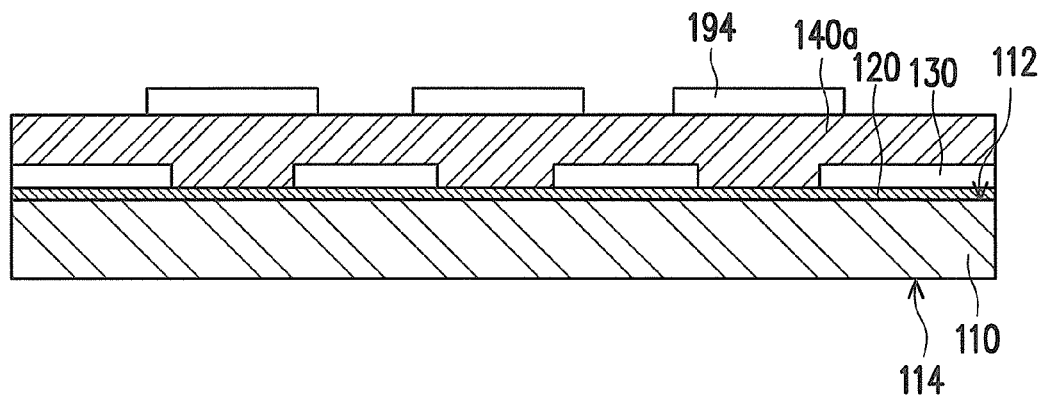
FIG. 2A and FIG. 2B are schematic cross-sectional views illustrating several steps in a manufacturing method of a package structure according to another embodiment of the invention.
Figure 2B:
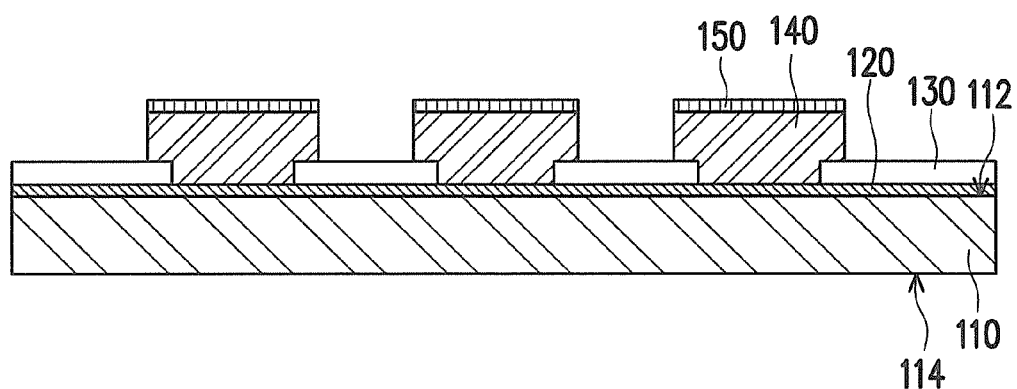

Although the patterned circuit layer 140 of this embodiment is formed by performing a plating process, the patterned circuit layer 140 in other embodiments can be formed by performing a subtractive process. FIG. 2A and FIG. 2B are schematic cross-sectional views illustrating several steps in a manufacturing method of a package structure according to another embodiment of the invention. In particular, after the step shown in FIG. 1B is performed, i.e., after the patterned insulating layer 130 is formed on the first seed layer 120, a metal layer 140a is foamed on the first seed layer 120, as indicated in FIG. 2A. Here, the metal layer 140a covers the patterned insulating layer 130 and a portion of the first seed layer 120. A patterned photoresist layer 194 is formed on the metal layer 140a. The patterned photoresist layer 194 exposes a portion of the metal layer 140a. With reference to FIG. 2A and FIG. 2B, a portion of the metal layer 140a is removed with use of the patterned photoresist layer 194 as an etching mask, so as to expose a portion of the patterned insulating layer 130 and form the patterned circuit layer 140. The patterned photoresist layer 194 is removed, and the surface treatment layer 150 is formed on the patterned circuit layer 140. The step shown in FIG. 1E is then performed to completely form the package structure 100.

In light of the foregoing, the package structure described in the embodiments of the invention has the patterned insulating layer. Hence, when the solder balls are formed on the lower surface of the patterned circuit layer, the patterned insulating layer can protect the adjacent solder balls from short circuits caused by performing a reflow process. As such, the package structure described in the embodiments of the invention can have favorable electrical performance and structural reliability. Moreover, the metal substrate serves as the carrier according to the embodiments of the invention, and the patterned circuit layer is formed by performing a plating process or a subtractive process. After the chip is completely packaged, the metal substrate and the seed layer are removed. Thereby, in comparison with the conventional package structure that has the core dielectric layer, the package structure described in the embodiments of the invention can have a relatively small thickness. In addition, the line width and the thickness of the patterned circuit layer can be adjusted by controlling the patterned photoresist layer in the invention, and therefore the required fine circuit layer can be formed.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing method of a package structure, comprising:
    providing a metal substrate, the metal substrate having a first surface, a first seed layer being formed on the first surface;
    forming a patterned insulating layer on the first seed layer, the patterned insulating layer exposing a portion of the first seed layer;
    forming a patterned circuit layer, comprising:
        forming a second seed layer on the patterned insulating layer, the second seed layer encapsulating the patterned insulating layer;
        forming a patterned photoresist layer on a portion of the first seed layer, a portion of the second seed layer, and a second surface of the metal substrate opposite to the first surface, wherein the patterned photoresist layer exposes a portion of the first seed layer and a portion of the second seed layer;
        plating the patterned circuit layer onto the portion of the first seed layer and the portion of the second seed layer exposed by the patterned photoresist layer, wherein the patterned circuit layer is plated with use of the patterned photoresist layer as a plating mask; and
        removing the patterned photoresist layer and the portion of the second seed layer underlying the patterned photoresist layer to expose a portion of the patterned insulating layer and the second surface of the metal substrate;
    performing a chip-bonding process to electrically connect a chip to the patterned circuit layer;
    forming an encapsulant, the encapsulant encapsulating the chip and the patterned circuit layer and covering a portion of the patterned insulating layer;
    removing the metal substrate and the first seed layer to expose a bottom surface of the patterned insulating layer and a lower surface of the patterned circuit layer; and
    forming a plurality of solder balls on the lower surface of the patterned circuit layer.

2. The manufacturing method of the package structure as recited in claim 1, further comprising:
    forming a surface treatment layer on the patterned circuit layer before removing the patterned photoresist layer and the portion of the second seed layer.

3. The manufacturing method of the package substrate as recited in claim 1, wherein the step of forming the patterned circuit layer comprises:

forming a metal layer on the first seed layer, wherein the metal layer covers the patterned insulating layer and a portion of the first seed layer;

forming a patterned photoresist layer on the metal layer, wherein the patterned photoresist layer exposes a portion of the metal layer;

removing the portion of the metal layer with use of the patterned photoresist layer as an etching mask, so as to expose a portion of the patterned insulating layer and form the patterned circuit layer; and removing the patterned photoresist layer.

4. The manufacturing method of the package structure as recited in claim 3, further comprising:

forming a surface treatment layer on the patterned circuit layer after removing the patterned photoresist layer.

5. The manufacturing method of the package structure as recited in claim 1, wherein the chip-bonding process comprises a wire-bonding process or a flip-chip bonding process.

6. A package structure formed by conducting the manufacturing method as recited in claim 1, the package structure comprising:

the patterned insulating layer having the bottom surface;

the patterned circuit layer configured on the patterned insulating layer and covering the portion of the patterned insulating layer, wherein the lower surface of the patterned circuit layer is substantially aligned to the bottom surface of the patterned insulating layer;

the solder balls configured on the lower surface of the patterned circuit layer;

the chip electrically connected to the patterned circuit layer; and the encapsulant encapsulating the chip and the patterned circuit layer and covering the portion of the patterned insulating layer.

7. The package structure as recited in claim 6, further comprising a surface treatment layer located on the patterned circuit layer.

8. The package structure as recited in claim 6, wherein the surface treatment layer comprises a nickel layer, a gold layer, a silver layer, or a nickel palladium gold layer.

9. The package structure as recited in claim 6, wherein the chip is electrically connected to the patterned circuit layer by performing a wire-bonding process or a flip-chip bonding process.

* * * * *